United States Patent
Danna et al.

(10) Patent No.: US 7,419,346 B2
(45) Date of Patent: Sep. 2, 2008

(54) INTEGRATED SYSTEM FOR TOOL FRONT-END WORKPIECE HANDLING

(75) Inventors: Mark Danna, Scotts Valley, CA (US); Roger G. Hine, Palo Alto, CA (US); Anthony C. Bonom, Fremont, CA (US)

(73) Assignee: Asyst Technologies, Inc., Fremont, CA (US)

( * ) Notice: Subject to any disclaimer, the term of this patent is extended or adjusted under 35 U.S.C. 154(b) by 0 days.

(21) Appl. No.: 10/194,702

(22) Filed: Jul. 12, 2002

(65) Prior Publication Data

US 2003/0091409 A1 May 15, 2003

Related U.S. Application Data

(60) Provisional application No. 60/305,980, filed on Jul. 16, 2001.

(51) Int. Cl.
*B65G 49/07* (2006.01)
(52) U.S. Cl. ............... 414/222.11; 414/217; 414/939
(58) Field of Classification Search .............. 414/217, 414/939, 222.11, 222.13
See application file for complete search history.

(56) References Cited

U.S. PATENT DOCUMENTS

| | | | |
|---|---|---|---|
| 4,682,927 A * | 7/1987 | Southworth et al. ......... 414/217 |
| 4,775,281 A * | 10/1988 | Prentakis ............... 414/416.03 |
| 5,344,365 A * | 9/1994 | Scott et al. ................. 454/187 |
| 5,417,537 A * | 5/1995 | Miller ........................ 414/217 |
| 5,664,254 A | 9/1997 | Ohkura et al. |
| 5,772,386 A | 6/1998 | Mages et al. |
| 6,002,840 A * | 12/1999 | Hofmeister ................. 700/245 |
| 6,042,324 A * | 3/2000 | Aggarwal et al. ........... 414/411 |
| 6,053,688 A | 4/2000 | Cheng |
| 6,157,450 A * | 12/2000 | Marchese-Ragona et al. ......................... 356/602 |
| 6,158,946 A * | 12/2000 | Miyashita ................... 414/411 |
| 6,368,049 B1 * | 4/2002 | Osaka et al. ................ 414/783 |
| 6,501,070 B1 * | 12/2002 | Bacchi et al. ............... 250/239 |
| 6,540,869 B2 * | 4/2003 | Saeki et al. ............ 156/345.31 |
| 6,585,470 B2 * | 7/2003 | Van Der Meulen ......... 414/217 |
| 6,679,671 B2 * | 1/2004 | Blonigan et al. ............ 414/217 |
| 6,863,485 B2 * | 3/2005 | Mizokawa et al. .......... 414/217 |

FOREIGN PATENT DOCUMENTS

WO    WO 0179090 A    10/2001

* cited by examiner

*Primary Examiner*—Charles A Fox
(74) *Attorney, Agent, or Firm*—Martine Penilla & Gencarella, LLP

(57) ABSTRACT

An integrated system is disclosed for workpiece handling and/or inspection at the front end of a tool. The system comprises a rigid member of unitary construction such as a metal plate which mounts to the front of a tool associated with a semiconductor process. The front end components, including the load port assemblies, prealigners and workpiece handling robot, are mounted to the plate to provide precise and repeatable positioning of the front end components with respect to each other.

13 Claims, 13 Drawing Sheets

INTEGRATED SYSTEM FOR TOOL FRONT-END WORKPIECE HANDLING

RELATED APPLICATION

This application claims priority to provisional application Ser. No. 60/305,980, filed on Jul. 16, 2001, entitled "Integrated System For Tool Front-End Workpiece Handling" and is hereby incorporated in its entirety.

BACKGROUND OF THE INVENTION

1. Field of the Invention

The present invention relates to the processing of workpieces such as semiconductor wafers, and in particular to an integrated system for workpiece handling and inspection at the front end of a tool associated with a semiconductor process.

2. Description of Related Art

A SMIF system proposed by the Hewlett-Packard Company is disclosed in U.S. Pat. Nos. 4,532,970 and 4,534,389. The purpose of a SMIF system is to reduce particle fluxes onto semiconductor wafers during storage and transport of the wafers through the semiconductor fabrication process. This purpose is accomplished, in part, by mechanically ensuring that during storage and transport, the gaseous media (such as air or nitrogen) surrounding the wafers is essentially stationary relative to the wafers, and by ensuring that particles from the ambient environment do not enter the immediate wafer environment.

A SMIF system has three main components: (1) minimum volume, sealed pods used for storing and transporting wafers and/or wafer cassettes; (2) an input/output (I/O) minienvironment located on a semiconductor processing tool to provide a miniature clean space (upon being filled with clean air) in which exposed wafers and/or wafer cassettes may be transferred to and from the interior of the processing tool; and (3) an interface for transferring the wafers and/or wafer cassettes between the SMIF pods and the SMIF minienvironment without exposure of the wafers or cassettes to particulates. Further details of one proposed SMIF system are described in the paper entitled "SMIF: A TECHNOLOGY FOR WAFER CASSETTE TRANSFER IN VLSI MANUFACTURING," by Mihir Parikh and Ulrich Kaempf, *Solid State Technology*, July 1984, pp. 111-115.

Systems of the above type are concerned with particle sizes which range from below 0.02 microns ($\mu m$) to above 200 $\mu m$. Particles with these sizes can be very damaging in semiconductor processing because of the small geometries employed in fabricating semiconductor devices. Typical advanced semiconductor processes today employ geometries which are one-half $\mu m$ and under. Unwanted contamination particles which have geometries measuring greater than 0.1 $\mu m$ substantially interfere with 1 $\mu m$ geometry semiconductor devices. The trend, of course, is to have smaller and smaller semiconductor processing geometries which today in research and development labs approach 0.1 $\mu m$ and below. In the future, geometries will become smaller and smaller and hence smaller and smaller contamination particles and molecular contaminants become of interest.

SMIF pods are in general comprised of a pod door which mates with a pod shell to provide a sealed environment in which wafers may be stored and transferred. So called "bottom opening" pods are known, where the pod door is horizontally provided at the bottom of the pod, and the wafers are supported in a cassette which is in turn supported on the pod door. It is also known to provide front opening pods referred to as front opening unified pods, or FOUPs, in which the pod door is located in a vertical plane, and the wafers are supported either in a cassette mounted within the pod shell, or to shelves mounted in the pod shell.

During the fabrication of semiconductor wafers, the SMIF pods are used to transport the workpieces between various tools in the wafer fab. These tools include process tools for forming the integrated circuit patterns on the wafers, metrology tools for testing the wafers, sorters for sorting and rearranging the wafers within one or more SMIF pods, and stockers for large scale storage of the SMIF pods. The tools are generally laid out in a wafer fab in one of two configurations, a bay and chase configuration or a ballroom configuration. In the former arrangement, only the front of the tool including the workpiece I/O port is maintained in the cleanroom environment of class 1 or better. In a ballroom configuration, the tools are arranged in clusters according to the operations they perform, with the entire tool being maintained in the cleanroom environment of class 1 or better.

Tools within a wafer fab include a front end interface which houses components that facilitate and monitor the transfer of wafers and other workpieces between the pods to the tools. A conventional front end unit 20 is shown in FIGS. 1 and 2. The unit 20, which is generally constructed at a tool manufacturer and then shipped to a wafer fab, includes a generally square or rectangular housing 22 which is affixed to the front of a tool. A front end unit 20 generally includes a workpiece handling robot 24 mounted within the housing and capable of r, θ, z motion to transfer workpieces between the workpiece carriers, tool and other front end components. The robot is generally mounted within the housing with leveling screws that allow the adjustment of the planarity of the robot once the unit 20 is constructed and affixed to a tool.

In addition to a robot 24, front end unit 20 generally includes one or more prealigners 26 for performing the operation of wafer center identification, notch orientation, and indicial mark reading. The prealigner(s) 26 are bolted into the housing 22 with leveling screws allowing the planarity of the prealigner(s) to be adjusted once the unit 20 is constructed and affixed to a tool.

The front end unit 20 further includes one or more load port assemblies 28 for receiving a workpiece carrier, opening the carrier, and presenting the workpieces to the robot for transfer of the workpieces between the carrier, prealigners and tool. For 300 mm wafer processing, a vertically oriented frame, commonly referred to as a box opener-loader tool standard interface (or "BOLTS" interface), has been developed by Semiconductor Equipment and Materials International ("SEMI"). The BOLTS interface attaches to, or is formed as part of, the front end of a tool, and provides standard mounting points for a load port assembly to attach to the tool. U.S. Pat. No. 6,138,721, entitled "Tilt and Go Load Port Interface Alignment System," to Bonora et al. discloses a system for adjusting a load port assembly to the proper position adjacent a BOLTS interface and then affixing the load port assembly to the interface. This patent is assigned to the owner of the present invention and is incorporated by reference in its entirety herein.

Once the robot 24, the prealigners 26 and load port assemblies 28 have been mounted to the housing 22, the front end unit 20 is shipped to the wafer fab and affixed to a tool within the fab. After being properly secured to the tool, the front end components are leveled within the housing 22 via the leveling screws, and the robot is then taught the acquisition and drop-off positions it will need to access for workpiece transfer between the load port assemblies, the prealigners and the tool. A system for teaching the various acquisition and drop-off positions for the robot within the tool front end is disclosed in U.S. patent application Ser. No. 09/729,463, entitled "Self Teaching Robot," which application is assigned to the owner of the present application and which application is incorporated by reference herein in its entirety. Once the robot positions have been taught, side panels are attached to housing 22 to substantially seal the housing against the surrounding environment.

As described above, conventional tool front ends include a plurality of separate and independent workpiece handling components mounted within an assembled housing. The housing includes a structural frame, bolted, constructed or welded together, and a plurality of panels affixed to the frame. After the housing is assembled, the front end components are affixed to the various panels. It is a disadvantage to prior art front ends that the overall system tolerances are compounded with each frame member, panel and component connection. The result is that the assembled front end components are poorly aligned and need to be adjusted to the proper position with respect to each other. The robot must also be taught the relative positions of the components so that the front end components can interact with each other. This alignment and teaching process must take place every time there is an adjustment to one or more of the front end components.

A further shortcoming of the prior art is that front end components are frequently made by different suppliers, each with its own controller and communication protocols. Steps must be taken upon assembly of the front end so that the controllers of each component can communicate with each other and the components can interact with each other. The separate controllers also complicate maintenance and add to the parts and electrical connections provided in the front end. Further still, especially in a ballroom configuration, the conventional front end unit takes up a large amount of space within a class 1 cleanroom environment where space is at a premium.

SUMMARY OF THE INVENTION

It is therefore an advantage of the present invention to integrate all of the front end components into a single unit.

It is another advantage of the present invention to provide a common, precision datum for all front end components.

It is a further advantage of the present invention to reduce the number of mounting surfaces, resulting in an increase in alignment accuracy and repeatability with component addition or removal.

It is a further advantage of the present invention to mount all front end components in a known and repeatable relation to each other.

It is a further advantage of the present invention to reduce the number of parts used in a tool front end while maintaining all of the functionality needed in present day tool front ends.

It is a still further advantage of the present invention to provide a single front end controller for controlling all front end operations.

It is another advantage of the present invention to obviate the need for assembly of front end components at the tool manufacturer.

It is a further advantage of the present invention to obviate much of the need to teach the workpiece acquisition and drop-off positions to the workpiece handling robot.

It is another advantage of the present invention to decrease the footprint required by the front end components.

It is another advantage of the present invention to reduce manufacturing costs by reducing redundant mechanical and electrical hardware.

It is a further advantage of the present invention to utilize the space below the load port assembly access port.

It is another advantage of the present invention to increase the vertical stroke of the workpiece handling robot relative to conventional designs.

It is a still further advantage of the present invention to provide sealed transfer of workpieces between adjacent tools without having to transfer the workpieces back to the carriers.

It is another advantage of the present invention to seal the front end against leakage in the event of a hostile environment within the tool.

These and other advantages are provided by the present invention which in preferred embodiments relates to an integrated system for workpiece handling and/or inspection at the front end of a tool. The system comprises a rigid member of unitary construction such as a metal plate which mounts to the front of a tool associated with a semiconductor process. In embodiments comprising a plate, it may bolt to the tool by a frame sandwiched between the plate and tool.

The components conventionally mounted to a housing at the front end of a tool are each mounted to the plate in a fixed and repeatable position with respect to each other. In a preferred embodiment, the components mounted to the plate include a pair of load port assemblies fixedly bolted to a front surface of the plate. The load port assemblies are provided for receiving a workpiece carrier, opening the carrier, and presenting the workpieces within the carrier for transfer between the carrier and the tool. A pair of prealigners may further be mounted to the front surface of the plate. The prealigners are provided for identifying a center of the workpiece, locating the workpiece notch at a desired orientation, and reading an indicial mark on the workpiece. In a preferred embodiment, the prealigners include a buffer paddle on which the workpieces may be buffered to increase the throughput of the prealigners and the front end system in general. The plate preferably further includes a workpiece handling robot affixed for vertical translation to a back surface of the plate. The robot transfers workpieces between the load port assemblies, prealigners and the tool. The front end system according to the present invention further includes a single controller for controlling and coordinating the operation of each of the front end components.

Integrating the front end components onto a single plate significantly reduces the tolerance of the front end system, and provides a significant degree of precision and repeatability of the positions of the front end components with respect to each other. This in turn greatly reduces the adjustments that are required when installing or modifying the front end system. Additionally, the number of parts in the front end system according to the present invention is reduced in comparison to conventional front end systems while at the same time maintaining all of the functionality of prior art systems. Moreover, integrating the components onto a single plate provides the potential to reduce the overall footprint of the combined front end and tool.

Each of the components in the front end system is monitored and controlled by a single controller. Prior art front end components were manufactured by different component suppliers, each with its own controller. Providing an integrated front end system run by a single controller greatly simplifies the software control of the overall system. Additionally, having a single controller reduces the number of parts and cabling necessary to front end operation. This allows for easier installation and maintenance of the system control.

BRIEF DESCRIPTION OF THE DRAWINGS

The present invention will now be described with reference to the drawings in which.

DETAILED DESCRIPTION

Figure 1:
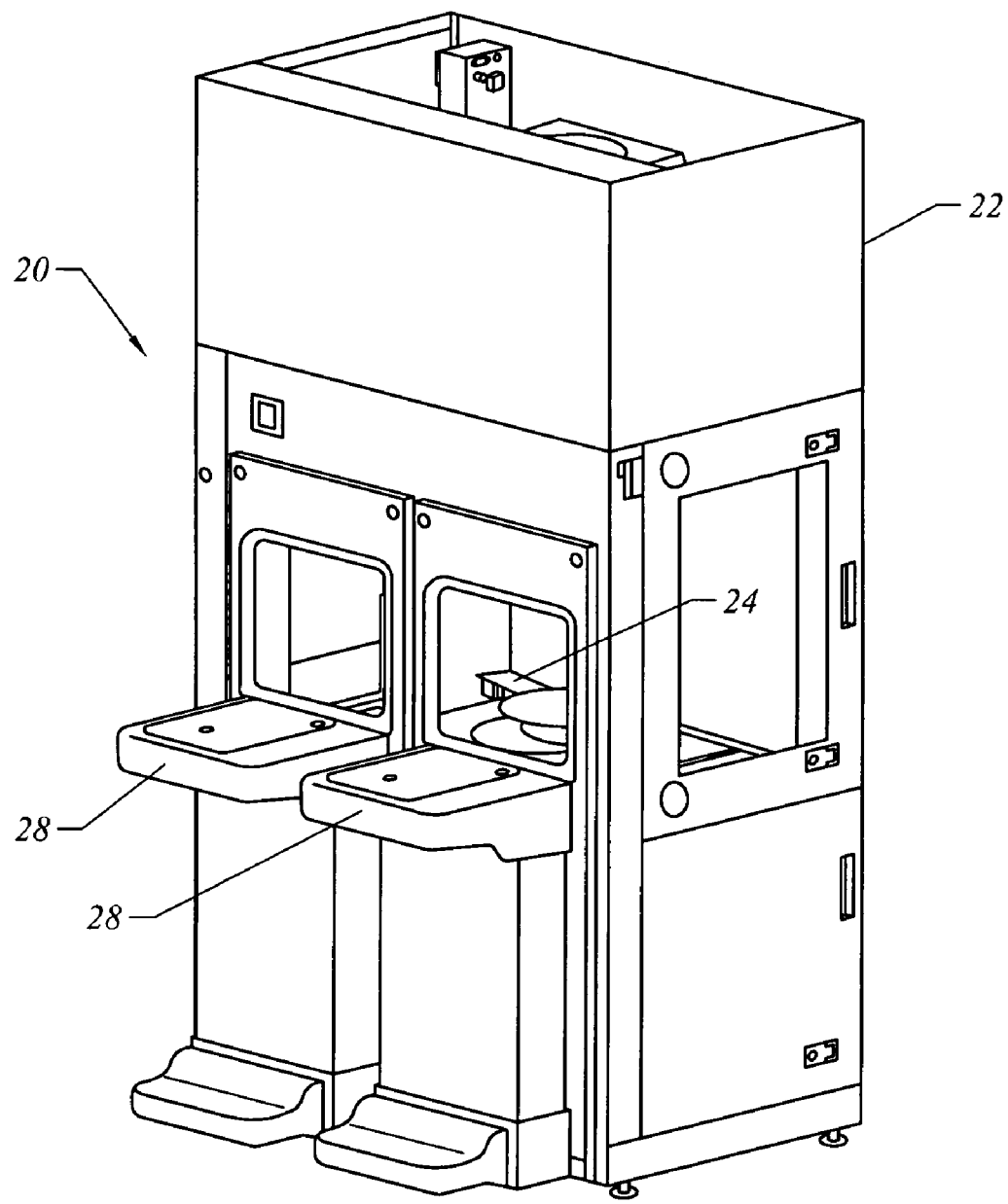
FIG. 1 is a perspective view of a front end assembly in accordance with the prior art.
Figure 2:
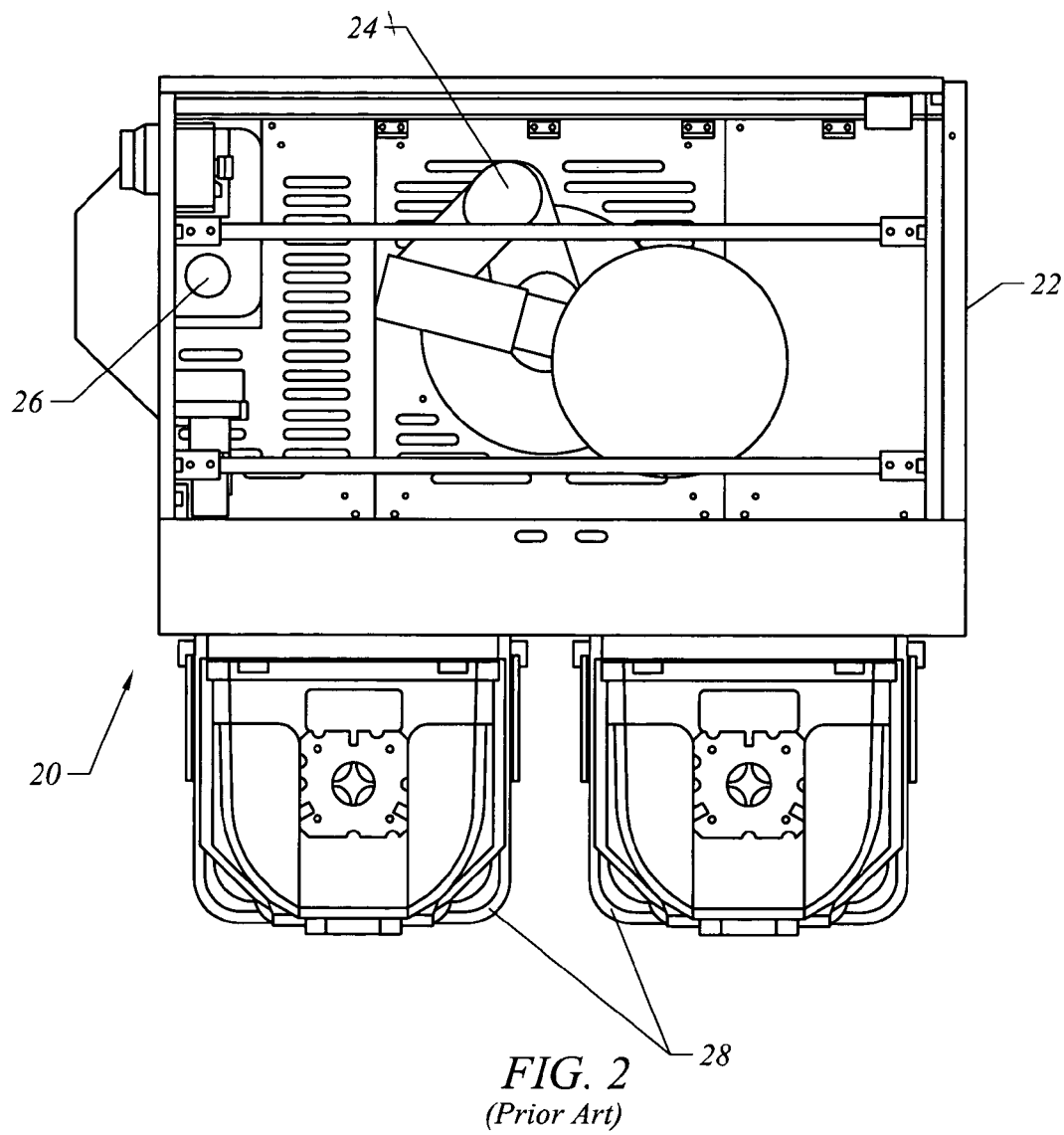
FIG. 2 is a top view of a front end assembly in accordance with the prior art.
Figure 3:
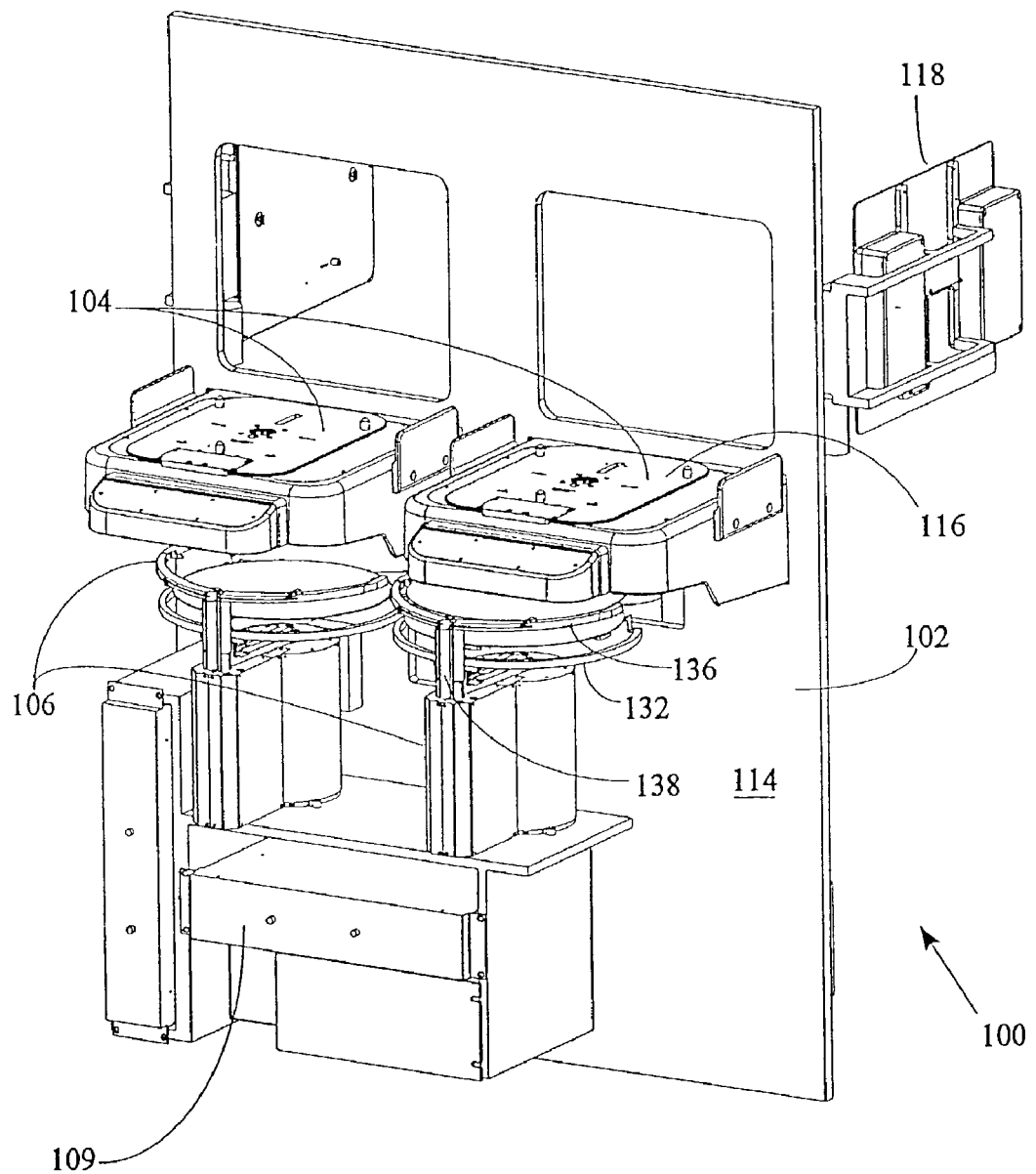
FIG. 3 is a front perspective view of the front end system according to the present invention.

The present invention will now be described with reference to FIGS. 3-13, which in general relate to an integrated system for workpiece handling and/or inspection at the front end of a tool. Preferred embodiments of the present invention are used for 300 mm semiconductor wafer fabrication. However, it is understood that the present invention may be used in the fabrication of workpieces other than semiconductor wafers, such as for example reticles, flat panel displays and magnetic storage disks, and the present invention may be used in the fabrication of workpieces larger or smaller than 300 mm, such as for example 200 mm and 150 mm. Moreover, while the present invention preferably operates with a SMIF system, it is understood that the present invention may operate with other workpiece transport systems.

Referring now to FIGS. 3-8, there is shown a front end system 100 according to the present invention. In one embodiment of the present invention, the front end system 100 comprises a plate 102, to which is affixed a pair of load port assemblies 104, a pair of prealigners 106 and a workpiece handling robot 108. A controller 109 is further provided for controlling and coordinating the operation of the load port assemblies 104, the prealigners 106 and the robot 108.

The plate 102 mounts to the front of a tool associated with a semiconductor process. As used here, such tools include, but are not limited to, process tools for forming integrated circuit patterns on semiconductor wafers, metrology tools for testing various properties of workpieces, and stockers for large scale storage of workpiece carriers. As used herein, a tool may also be simply an enclosure so that workpiece handling on the back side of the plate as described hereinafter may be carried out in an enclosed space. For example, the front end system 100 according to the present invention may comprise a sorter for arranging and transferring workpieces within one or more carriers. Alternatively, the front end system 100 according to the present invention may comprise a stand-alone prealigner. In both the sorter and stand-alone prealigner embodiments, the workpiece operations are carried out entirely by the front end system 100, but the enclosing tool to which the plate is attached provides an enclosed, clean environment in which the workpieces may be handled. In embodiments of the present invention, the plate may be considered as being part of the tool. In other embodiments of the present invention, the plate may be affixed to but considered separate from the tool.

Figure 5:
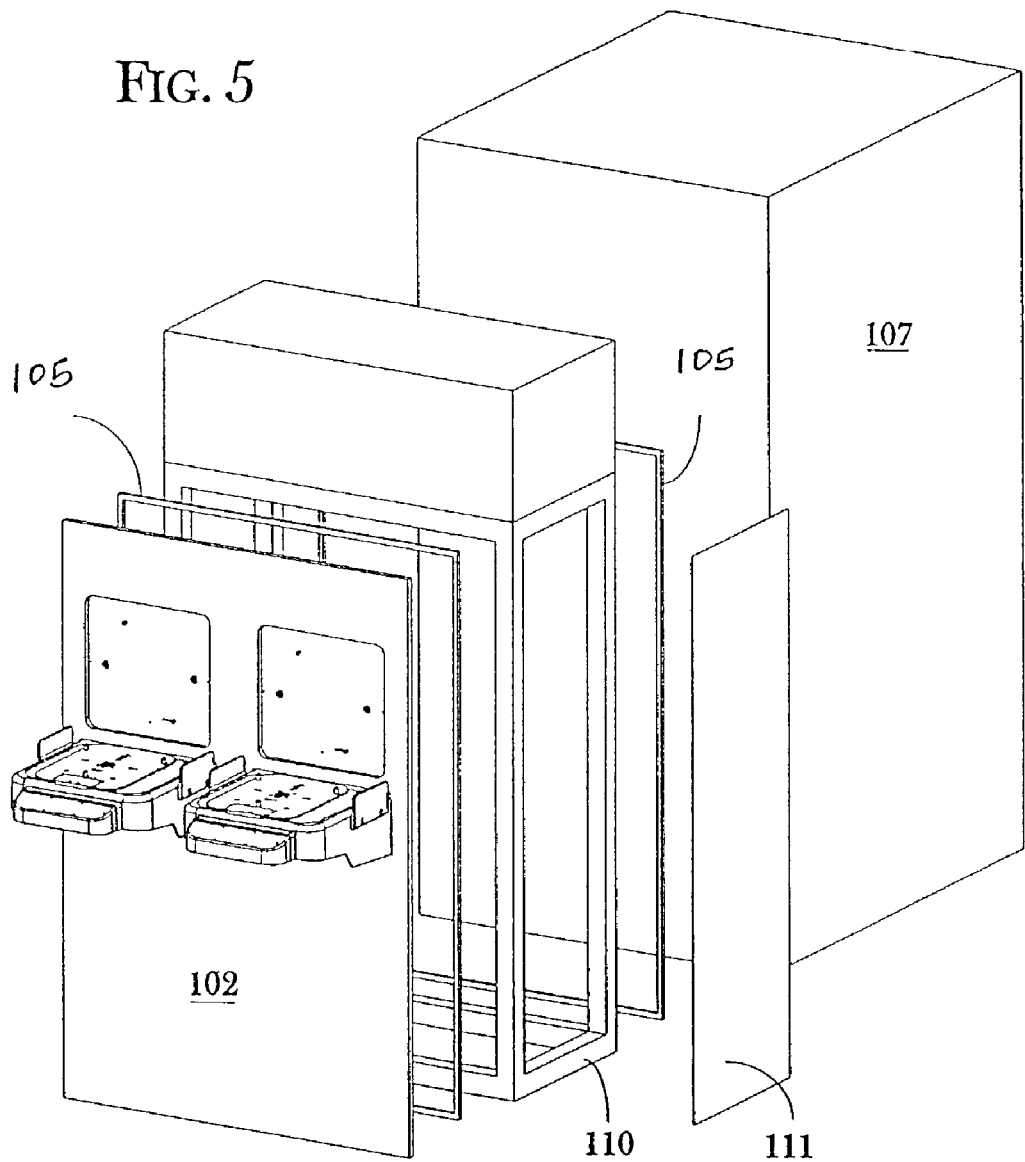
FIG. 5 is an exploded perspective view of the front end system according to the present invention with a tool.
Figure 6:
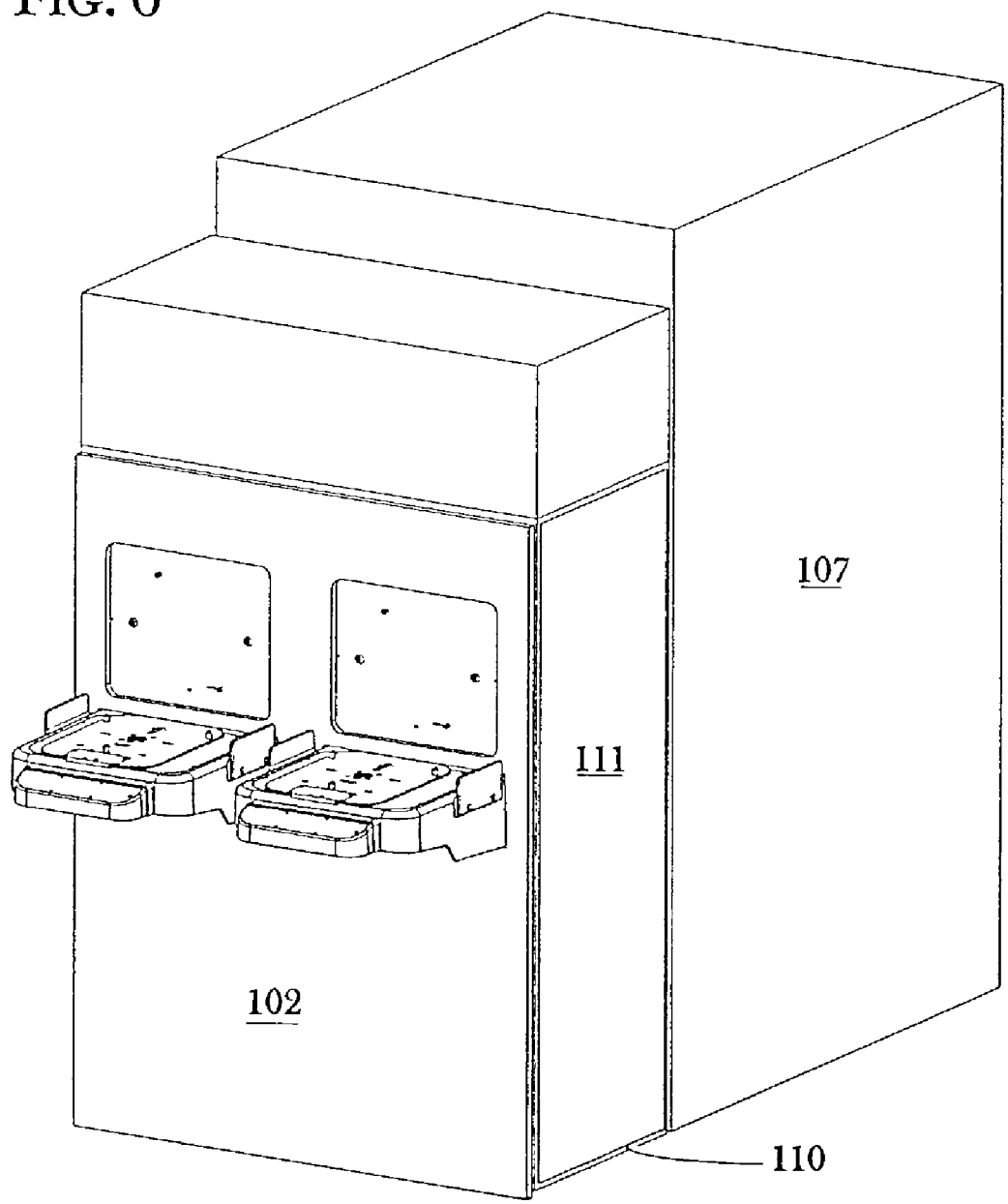
FIG. 6 is a perspective view of a front end system according to the present invention affixed to a tool.

As best seen in FIGS. 5 and 6, the plate 102 is affixed to a tool 107 via a frame 110 around the outer perimeter of the plate 102. In preferred embodiments, the plate 102 is bolted to the frame 110 with a first elastomeric seal 109 provided between the plate 102 and frame 110, and the frame 110 is in turn bolted to the front of the tool 107 with a second elastomeric seal 109 provided between the frame 110 and the tool 107. The frame 110 may have side panels 111 to enclose the frame 110. In a preferred embodiment, the plate 102 is affixed at a front of the frame 110. However, the positions of plate 102 and panel 111 may be switched in alternative embodiments so that the plate 102 is located generally perpendicularly to the front of tool 107.

Once affixed to the tool, an airtight seal is accomplished between the plate 102, frame 110 and the tool 107 around the outer perimeter of the plate 102. Generally, the pressure within the tool front end is maintained at a level higher than that of the atmosphere surrounding the tool 107 and front end so that any airborne particles or contaminants are blown out of the tool front end through any openings. However, on occasion, tools operate with a hostile environment, such as for example in a pure nitrogen environment, and it is necessary to completely seal the tool front end against the environment surrounding front end and tool. The provision of a single, planar interface formed by the plate 102 mounted to the tool 107 with the frame and seal makes it significantly easier than in a conventional front end design to form such a seal.

In addition to securing the plate 102 with respect to the tool 107, the frame 110 defines a space within which the robot can maneuver, and a space over which a fan/filter unit may be located. However, as all of the front end components are mounted directly on plate 102 in a preferred embodiment, the plate 102 and frame 110 are not subject to the shortcomings of the prior art, where the front end components were affixed to different portions of the front end housing.

As would be appreciated by those of skill in the art, the plate 102 may be affixed to the front of the tool 107 by other known fastening schemes in alternative embodiments. For example, the frame 110 may be omitted and the plate 102 bolted directly to the tool 107 with an elastomeric seal 109 being provided between the plate 102 and tool 107. It is also understood that the elastomeric seal 109 may be omitted from one or both sides of the frame 110 in alternative embodiments. It is further contemplated that the plate 102 be mounted to the floor and/or the ceiling adjacent the front of the tool 107 in alternative embodiments. When affixed to the tool 107, the plate 102 includes a front surface 112 facing the interior of the tool 107, and a back surface 114 facing the environment surrounding the tool 107.

The plate 102 is preferably formed of a rigid member which can be worked or formed into the desired surface configuration. In one embodiment, the plate 102 may be formed of rolled or cast aluminum with machined features.

The plate 102 may include an anodized surface finish to prevent or reduce outgassing. It is understood that the plate 102 may be formed of steel in alternative embodiments. Alternatively, the plate 102 may be formed of aluminum, or a first layer, reenforced by steel, or a second layer. However, in such embodiments where the plate 102 comprises more than one layer, the front end components requiring precise alignment are preferably mounted to a single layer of unitary construction. Tools within a wafer fab vary in size, and the size of the plate 102 may be customized to match the particular tool 107 to which the plate 102 is to be affixed.

In the embodiment shown in FIGS. 3-8, a pair of load port assemblies 104 may be fixedly bolted to the front surface 112 for receiving a workpiece carrier, opening the carrier, and presenting the workpieces within the carrier for transfer between the carrier, the prealigners 106 and the tool 107. The load port assemblies 104 are each comprised of two subassemblies that are mounted to the plate 102 separately. The first subassembly mounts to the front surface 112 and comprises an advance plate subassembly that receives the carrier and advances the carrier to the plate 102. The second subassembly mounts to the back surface 114 and comprises the port door subassembly that mates with and removes the carrier door. Although one such load port assembly 104 is described hereinafter, the following description applies to both load port assemblies 104.

In order to transfer the workpieces between a carrier and tool 107, the carrier is manually or automatically loaded onto a pod advance plate 116 of the advance plate subassembly so that a front surface of the carrier faces a front surface of a port door 118 of the port door subassembly. The port door 118 includes a pair of latch keys which are received in a corresponding pair of slots in the door latching assembly mounted within the carrier door. An example of a door latch assembly within a carrier door adapted to receive and operate with such latch keys is disclosed in U.S. Pat. No. 4,995,430 entitled "SEALABLE TRANSPORTABLE CONTAINER HAVING IMPROVED LATCH MECHANISM", to Bonora et al., which patent is assigned to the owner of the present invention, and which patent is incorporated by reference herein in its entirety. In addition to decoupling the carrier door from the carrier shell, rotation of the latch keys also lock the keys into their respective carrier door slots, thus coupling the carrier door to the port door. There are typically two latch key and slot pairs, each of which pairs are structurally and operationally identical to each other.

The pod advance plate 116 typically includes three kinematic pins, or some other registration feature, which mate within corresponding slots on the bottom surface of the carrier to define a fixed and repeatable position of the bottom surface of the carrier on the advance plate and toad port assembly 104. Once a pod is detected on the pod advance plate 116 by sensors in the load port assembly 104, the pod is advanced toward the load port until the carrier door lies in contact with or near to the port door 118. It is desirable to bring the front surfaces of the respective doors into contact with each other to trap particulates and to ensure a tight fit of the port door latch key in the pod door key slot. U.S. patent application Ser. No. 09/115,414, entitled, "POD DOOR TO PORT DOOR RETENTION SYSTEM," by Rosenquist et al., and U.S. patent application Ser. No. 09/130,254, entitled, "POD TO PORT DOOR RETENTION AND EVACUATION SYSTEM," by Fosnight et al. disclose systems ensuring a tight, clean interface between the carrier and port doors. These applications are assigned to the owner of the present invention, and are both incorporated by reference herein in their entirety.

Figure 7:
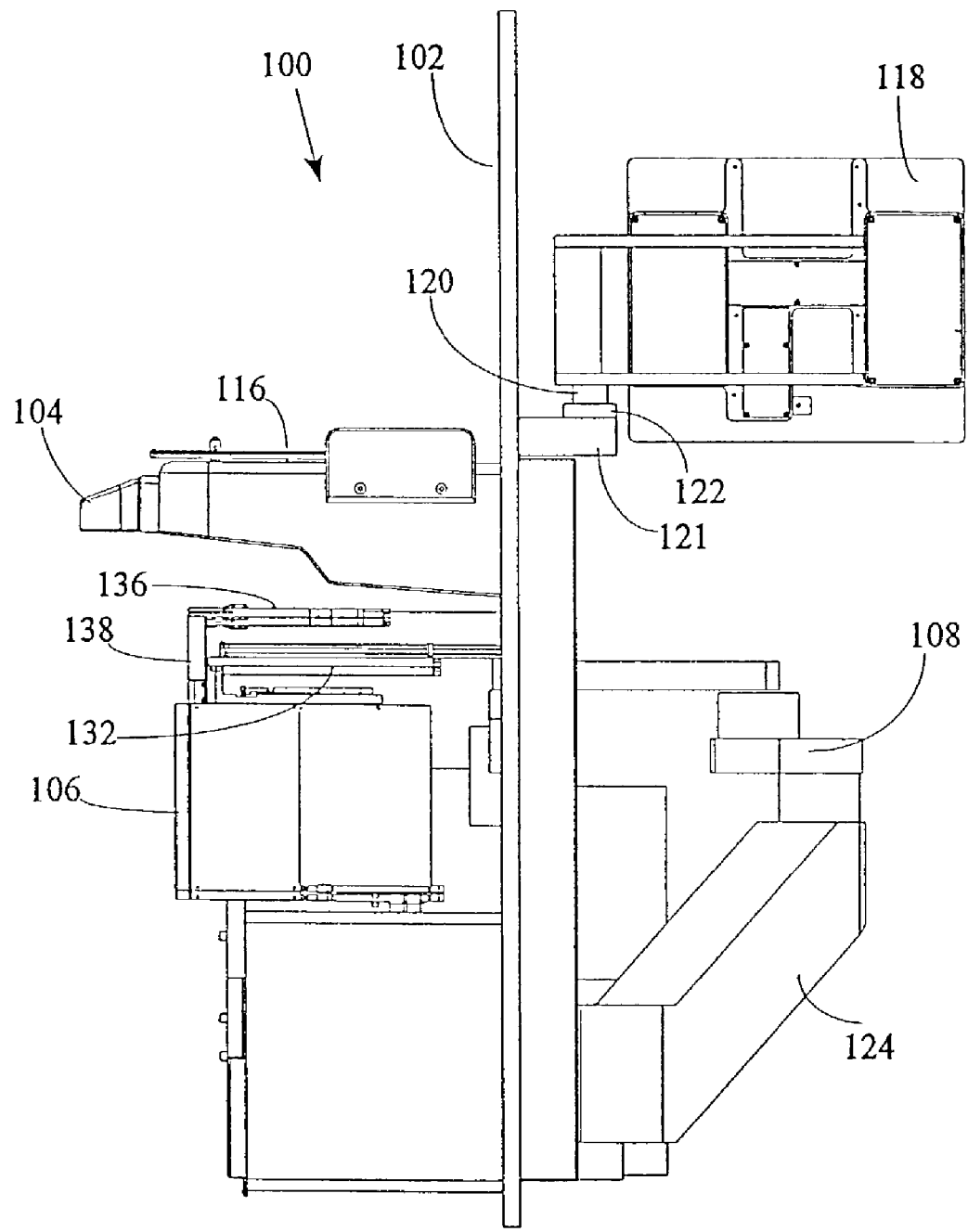
FIG. 7 is a left side view of the front end system according to the present invention.

Once the carrier and port doors are coupled, linear and/or rotational drives within the load port assembly move the carrier and port doors together into the interior of the front end system, and then away from the load port so that workpieces may thereafter be transferred between the carrier and tool through the load port. As shown in FIG. 7, in one embodiment, the port door 118 is affixed to an arm 120, which is mounted to a rotational drive 122. The drive 122 is in turn mounted on a linear slide 121. Once the carrier and port doors are affixed together, the controller 109 actuates slide 121 to translate the carrier and port doors back out of the port. The controller then actuates drive 122 to rotate the carrier and port doors off to the side substantially perpendicular to the plate 102. The shown linear slide and rotational drive configuration is of known construction, and the linear slide may comprise for example a motor with a cam or a lead screw, and the rotational drive may be a gear motor.

After the carrier and port doors are moved away from the load port, the robot 108 may transfer workpieces within the tool front end as explained hereinafter without interference from the stored carrier and port doors. Once operations on a workpiece lot at the tool have been completed and the workpieces have been returned to the carrier, the controller again actuates the drive 122 and slide 121 to move the doors back into the load port, whereupon the carrier door is transferred back to the carrier.

Figure 8:
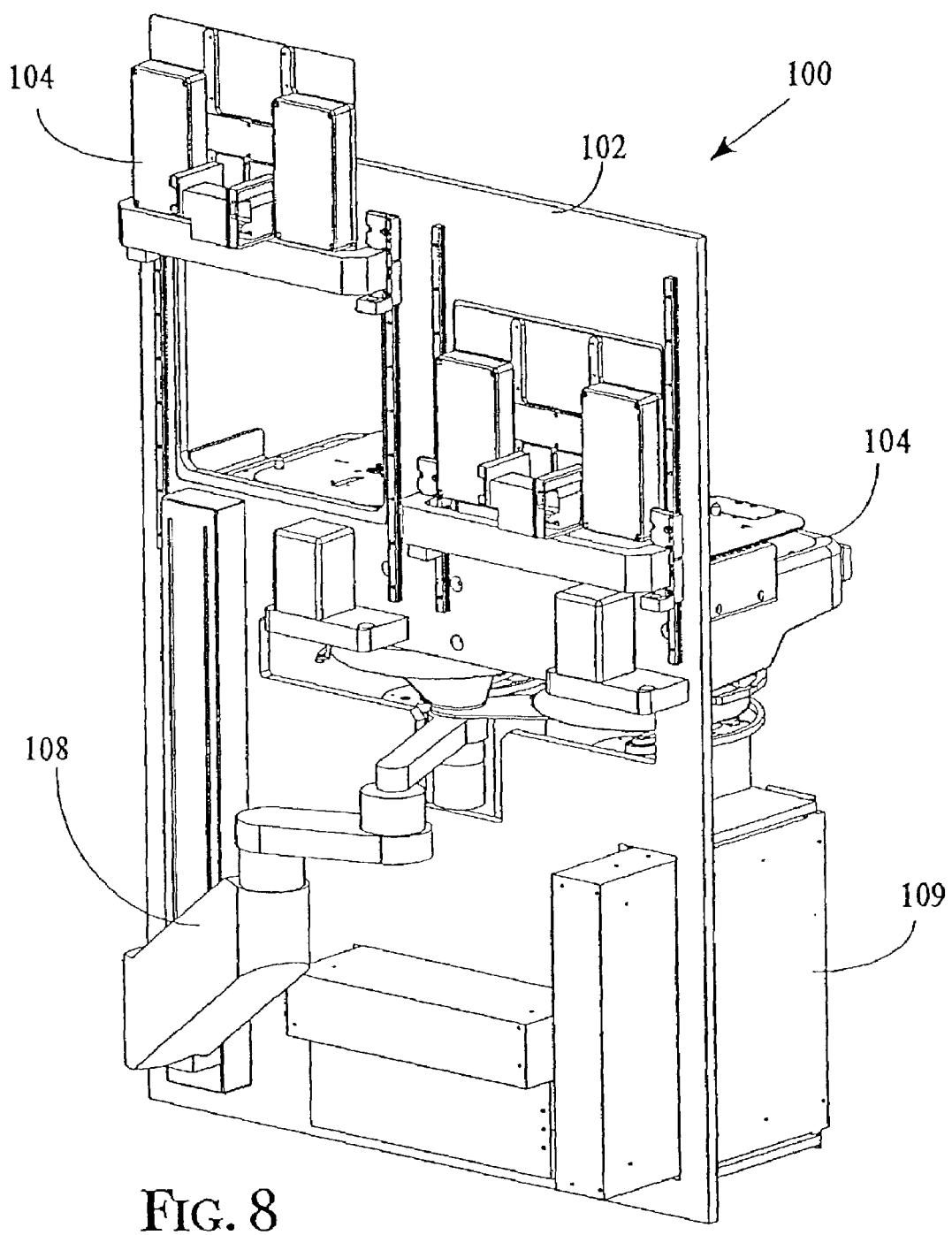
FIG. 8 is a rear perspective view of a front end system according to the present invention including a port door according to an alternative embodiment.

It is understood that instead of rotation off to the side, the carrier and port doors may be moved back away from the load port and into other positions of non-interference with workpiece transfer by the robot 108. For example, as shown in FIG. 8, once backed out of the load port by a the horizontal linear slide 121, the carrier and port doors may be raised upwards by a vertical drive on which the horizontal drive is mounted. Additionally, in embodiments of the invention not including prealigners or other components below the load port assemblies, the carrier and port doors may first be backed out of the load port and then lowered down away from the load port. It is also contemplated that the carrier and port doors be moved down a sufficient distance so that the robot 108 can access an opening below the advance plate subassembly but above the lowered carrier and port doors. Such an embodiment may operate with the pair of prealigners 106 on the front surface 112 as described hereinafter.

In a preferred embodiment, two load port assemblies 104 are bolted to the plate 102 side-by-side in a fixed and known position at the SEMI standard height of 900 mm from the ground. In alternative embodiments, there may be a single load port, or more than two load ports. Moreover, one or more of the load port assemblies may be mounted higher or lower than 900 mm. For example, the load ports may be stacked vertically one on top of the other to reduce the footprint of the plate. This stacked configuration is made possible by the increased vertical stroke of the robot 108 as described hereinafter. A storage shelf (not shown) may further be provided on the front surface 112 of the plate 102 for manual placement and temporary storage of a carrier by an operator.

Once the carrier door is separated from the carrier shell and moved in and away from the load port, workpieces from within the carrier are transferred by the robot 108. Robot 108 is mounted to the back surface 114 of the plate 102, beneath and to the side of the load ports, for translation along the Z-axis. Fixedly mounted for translation in plate 102, the robot 108 moves vertically with a precise and repeatable motion with respect to the plate 102.

As is known in the art, a lead screw (not shown) may be mounted within a track 123 on the plate 102 to the side of the load port, which lead screw is mounted to the armature of a drive mechanism such as a brushless, multi-pole motor controlled by the controller 109. A carriage (not shown) is mounted about the lead screw such that, upon rotation of the lead screw by the drive mechanism, the carriage is driven along the Z-axis. The drive mechanism and/or lead screw may include an encoder and/or other sensing devices of known construction to sense the position and angular rotation of the lead screw. Mounting the robot for vertical translation on the track 123 increases the potential Z-stroke of the robot 108 in comparison to robots including a conventional mast, extending up from the floor, to which are attached the robotic arms.

A stanchion 124 is fixedly bolted to and translates with the carriage within the track 123 on plate 102. With the Z-stroke mounting position of the robot 108 provided beneath the load port assemblies, the stanchion is angled upward to a degree so that, at a lowermost Z height, the robot 108 can transfer workpieces to the lowermost position of the prealigners 106, and so that at an uppermost Z height, the robot 108 can transfer workpieces to the load port assemblies 104. The stanchion 124 is also angled inward toward the center of the plate so that the axis of rotation of the robot 108 is generally centered between the two load port assemblies 104. It is understood that the vertical drive can be mounted at the center of the plate 102 as opposed to the sides of plate 102, in which case the stanchion 124 would not be angled inward.

The robot further includes a first arm 126 rotationally attached to an upper end of stanchion 124, and a second arm 128 rotationally attached to the first arm 126. The first arm 126 is mounted by bearings so as to rotate on stanchion 124 in a first X-Y plane perpendicular to the Z-axis of travel of the stanchion 124. The second arm 128 is mounted by bearings so as to rotate on the first arm 126 in a second X-Y plane parallel to the first X-Y plane. The first arm 126 and second arm 128 are preferably formed of a lightweight, durable metal having low outgassing properties, such as, for example, aluminum with an anodized surface finish. Operation of the workpiece handling robot 108 is controlled by controller 109. It is understood that the system according to the present invention may be used with other known robotic transfer devices for transferring workpieces. Such robot systems include dual armed robots, linear slide robots, a so-called "frog leg" linkage-type robot and a six axes industrial robot. Each of these robot systems is known in the art.

The workpiece handling robot 108 also includes a workpiece support tool such as an end effector 130 pivotally attached to an end of the second arm 128 opposite the first arm 126. The end effector 130 is capable of pivoting about a mounting point on the second arm 128 in a third X-Y plane parallel to the first and second X-Y planes. In a preferred embodiment, the end effector 130 may include a pair of independently actuated paddles that allow for parallel processing of workpieces. A system for parallel processing of workpieces is disclosed in U.S. patent application Ser. No. 09/547,551, entitled, "SYSTEM FOR PARALLEL PROCESSING OF WORKPIECES," to Babbs et al., which application is assigned to the owner of the present invention and which application is incorporated by reference herein in its entirety. In such an embodiment, robot 108 includes a dual paddle end effector including a lower paddle rotatably coupled to an end of the second arm 128, and an upper paddle rotatably coupled to the lower paddle. Processing of workpieces in accordance with this embodiment is described hereinafter. It is also understood that the end effector 130 may comprise a single paddle.

In one embodiment, the pivotal position of the first arm 126, second arm 128, and end effector 130 are controlled with respect to each other by a combination of the controller 109 and mechanical linkages such that the lower paddle of the end effector is constrained to move along radials emanating from the Z-axis of rotation of the first arm 126 on stanchion 124. In another embodiment, the robot arms and end effector can be controlled to move according to a so-called "path planning algorithm" which is known in the art. It is understood that other robot motion is contemplated in alternative embodiments.

In order to transfer workpieces, the end effector 130 moves horizontally under the workpiece to be transferred and then moves upward (as a result of the carriage riding along the lead screw) to lift the workpiece off of its resting place. As is known in the art, the end effector 130 may include edge grips for supporting the workpiece at its edges. The position of the edge grips are provided so as not to interfere with the edge grips of the prealigners 106 (explained hereinafter) during workpiece transfer between the end effectors and prealigners. Alternatively, the end effector 130 may be a blade type end effector for supporting a workpiece by its bottom surface. In such embodiments, a vacuum source (not shown) may be affixed to or remote from the plate 102, which creates a negative pressure that is communicated through the workpiece handling robot via flexible vacuum tubes to the surface of the end effector blade. Upon activation of the vacuum source, a negative pressure is formed at the surface of the end effector blade creating a suction capable of holding a workpiece firmly thereon. A vacuum sensor (not shown) of known construction may also be provided on the robot and associated with the vacuum system for detecting when a workpiece is engaged with the end effector and restricting the pull of air through the vacuum tubes. It is understood the present invention is not limited to the end effector described above and that a variety of end effector designs may be used as long as the end effector has the capability to pick up and drop off workpieces.

One example of a workpiece handling robot suitable for use in the present invention is a conventional AXYS-407 series robot available from Asyst Technologies, Inc., Fremont, Calif., modified to include stanchion 124. However, it is understood that embodiments of the present invention can operate with various systems capable of extracting a workpiece from a carrier on a workstation, and repositioning the workpiece to a desired location.

Figure 9:
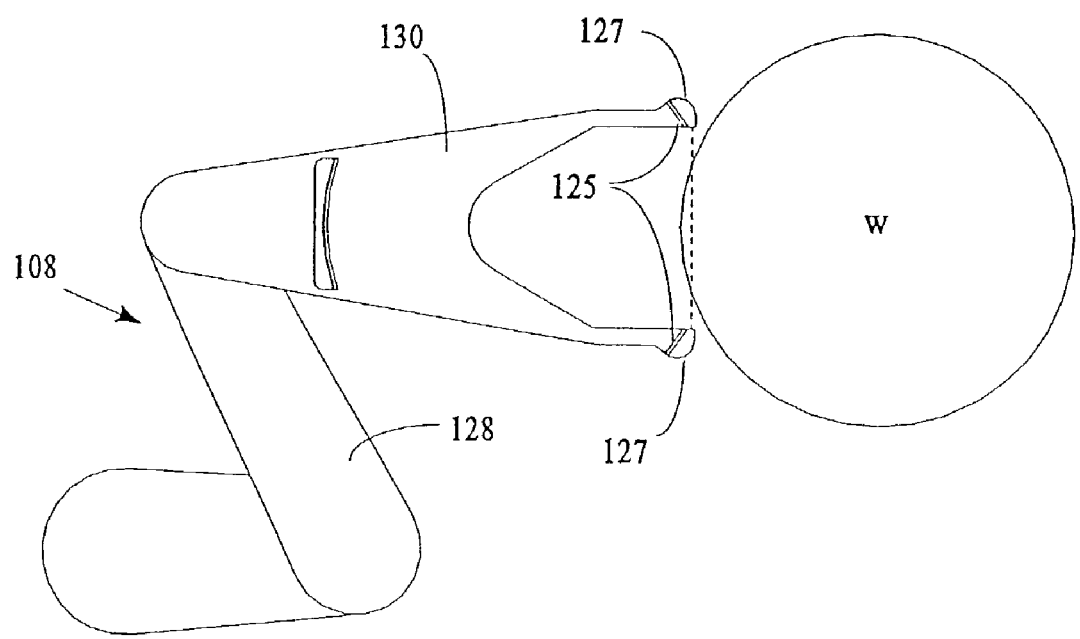
FIG. 9 is a top view of an end effector including a sensor for mapping workpieces in a carrier.

The load port assemblies 104 or the robot 108 can perform workpiece mapping operations to determine the position of workpieces within the carrier and/or to check for cross-slotted and double workpieces. In embodiments of the present invention operating with a port door that swings outward after coupling with the carrier door, or for embodiments of the invention including a port door that moves upwards, downwards or to the sides, workpiece mapping may be accomplished by the robot 108. In one such embodiment, an optical sensor of known construction may be mounted to the end effector 130. In order to map the workpieces, after the carrier and port door are removed from the load port, the lead screw within the plate 102 is rotated to move the end effector 130 along the Z-axis from the top of the carrier to the bottom, or visa-versa, with the sensor scanning the workpieces within the carrier as it translates. As shown in FIG. 9, the sensor 125 may be mounted on the forward most tips 127 of end effector 130 to transmit a beam from one tip to the other. In such embodiments, the sensor 125 may be a conventional break-the-beam sensor. As the end effector 130 travels vertically, the beam is broken by a workpiece W so that, upon completion of the vertical stroke in front of the workpieces, the position of each workpiece in the carrier is known. The position of the end effector 130 when the beam is broken and the length of time a beam is broken will also indicate cross-slotted and double workpieces.

In an alternative embodiment to that shown in FIG. 9, the sensor 125 may be mounted on the rear of the end effector 130. In this embodiment, the end effector 130 is rotated 180° for workpiece mapping so that the rear of the end effector including the sensor faces the carrier. The sensor according to this embodiment may include a transmitter that emits a beam that is reflected off the edge of the workpieces and back to a receiver in the sensor. It is understood that this type of reflective system may be included on the front side of the end effector 130 in alternative embodiments, and that the break the beam sensor described with respect to FIG. 9 may be included on the back side of the end effector 130. Other known sensing schemes are contemplated for mapping the workpieces and for detecting cross-slotted and double workpieces.

In embodiments of the present invention including a port door that moves into the tool and then vertically up or down, wafer mapping may alternatively be accomplished by an optical sensor of known design affixed to fingers that are mounted to the top of the port door (in the event the door moves downward) or on the bottom of the port door (in the event the door moves upward). In this embodiment, the workpieces are mapped by the sensor on the fingers which extend into the carrier as the port door moves upwards or downwards. Details relating to the sensor and fingers, as well as further embodiments for mapping workpieces as the port and carrier doors move upwards or downwards are disclosed in U.S. Pat. No. 6,188,323, entitled, "WAFER MAPPING SYSTEM," to Rosenquist et al., which patent is assigned to the owner of the present invention and which patent is incorporated by reference herein in its entirety.

Bolting the load port assemblies 104 at 900 mm directly to the front surface 112 of plate 102 allows the space below the load port assemblies 104 on the front surface 112 to be utilized for additional components. In accordance with a preferred embodiment of the present invention, a pair of prealigners 106 are bolted in a fixed position to the front surface 112 of the plate 102 below the load port assemblies 104. Prealigners 106 are provided for identifying a center of the workpieces, locating the workpiece notch at a desired orientation, and reading an indicial mark on the workpieces. Although one such prealigner 106 is described hereinafter, the following description applies to both prealigners.

The prealigner 106 includes a rotating support platform having edge contact aligner 132 on which the workpieces are received from the robot 108. When a workpiece is received in the aligner 132, the sloped sides center the workpiece automatically. This allows the radial runout determination step to be omitted. Alternatively, the workpiece may be received on a conventional vacuum chuck, in which the radial runout determination step is required. A motor rotates the edge contact aligner 132 to locate the position of the workpiece notch. In particular, as the workpiece is rotated, the edge of the workpiece passes through an analog sensor which is able to determine the position of the notch on the workpiece. The indicial mark is located a known distance from the notch, so that once the notch has been located, the workpiece is rotated on the chuck to position the indicial mark for reading under a camera such as a charge couple display (CCD) camera.

In a preferred embodiment, the prealigners 106 further include workpiece buffering capabilities. Such prealigners are disclosed in U.S. patent application Ser. No. 09/452,059, entitled, "WAFER ORIENTING AND READING MECHANISM," by Coady et al, which application is assigned to the owner of the present invention and which application is incorporated by reference in its entirety herein. In general, such a prealigner includes a buffer paddle 136 and a drive mechanism 138 for vertically translating the buffer paddle 136. In operation, a workpiece is transferred from a carrier to the back side of plate 102 by robot 108, lowered, and then transferred to the chuck of the prealigner 106 on the front side of plate 102 through an opening 136 in plate 102. Although not shown on each of the figures, the prealigner 106 on the front side of the plate is housed in an enclosure 138 affixed to the plate 102 so as to share the environment behind plate 102. The enclosure may be formed of a transparent material such as plexiglass so that the operations on the prealigner 106 may be viewed by an operator. The enclosure may be formed of other materials in alternative embodiments.

Once the first workpiece is loaded on the chuck, the prealigner 106 identifies the position of the notch, positions and reads the indicial mark and/or determines the radial runout of the workpiece. Thereafter, the buffer paddle lifts the first workpiece off the chuck. While these operations at the prealigner 106 are taking place, the robot 108 returns to the carrier and acquires a second workpiece and returns to the prealigner 106. The robot 108 then deposits the second workpiece on the chuck for processing, and acquires the first workpiece from the buffer paddle in a centered position. The robot 108 next returns the first workpiece to the carrier, or transfers the workpiece into the tool 107.

After the first workpiece has been carried away from the prealigner 106, and while processing on the second workpiece is taking place, the robot 108 acquires a third workpiece from the workpiece carrier and returns to the prealigner 106. At this point, the buffer paddle 130 is positioned above the second workpiece seated on the chuck. The end effector 130 deposits the third workpiece on the buffer paddle, acquires the second workpiece from the chuck and removes it from the prealigner 106. Thereafter, the buffer paddle with the third workpiece thereon moves downward to deposit the third workpiece on the chuck, whereupon the position of the notch is identified, the indicial mark is read, and the radial runout is determined. The prealigner 106 cycles through the above steps until each of the workpieces in the carrier have been processed.

Figure 4:
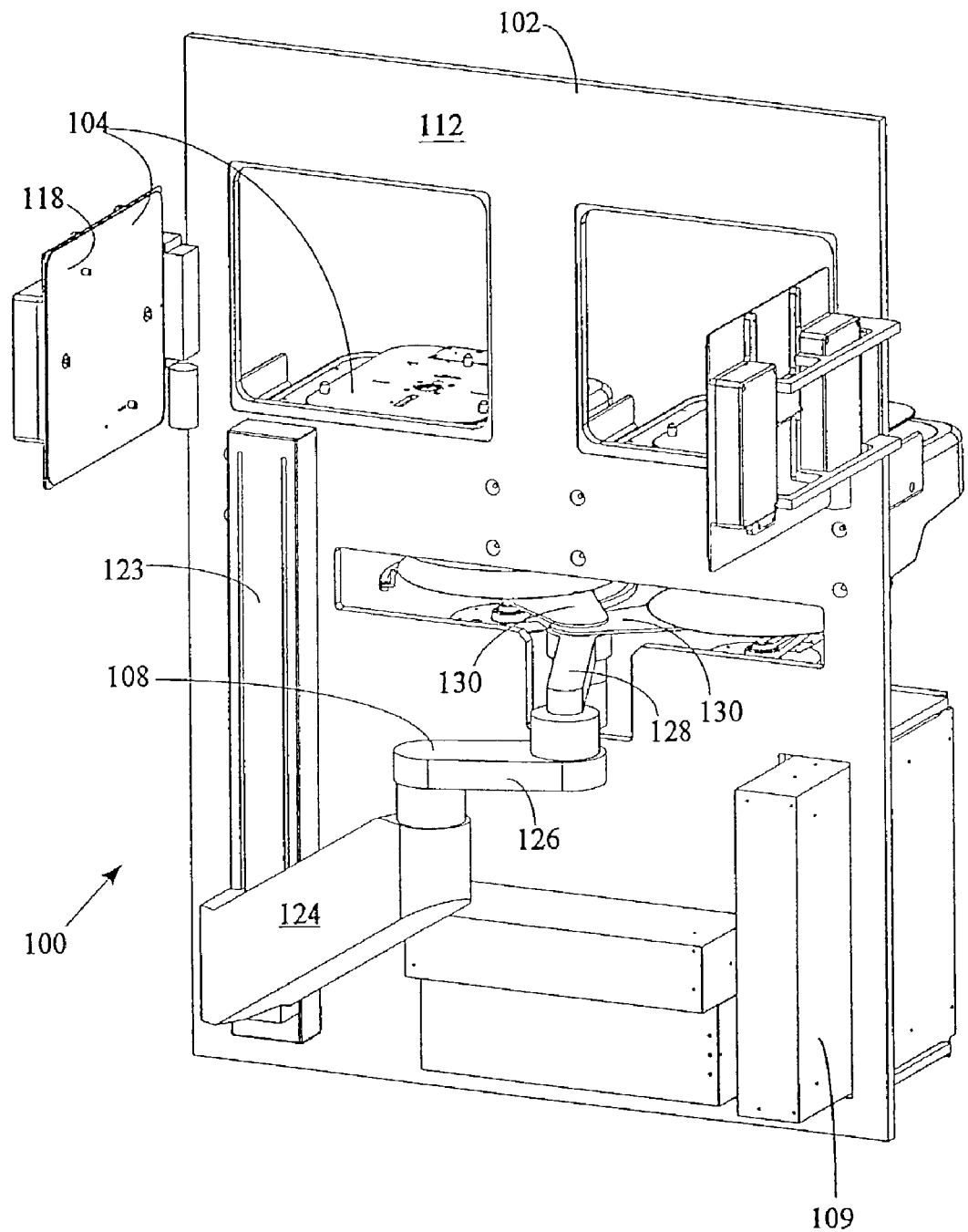
FIG. 4 is a rear perspective view of the front end system according to the present invention.

The two prealigners 106 together with the dual paddle end effector 130 as described above allow for parallel processing of workpieces. In one parallel processing embodiment of the present invention, the robot 108 may first acquire a pair of workpieces from adjacent shelves within a workpiece carrier. After withdrawing from the carrier, the respective paddles on the end effector 130 may fan out and transfer the workpieces to the aligners 132 of the respective prealigners 106 (as shown in FIG. 4). After processing of the workpieces on the prealigners 106 is complete, the fanned end effector paddles 130 may reacquire the workpieces, the upper paddle may return to its home position located directly over the lower paddle, and then return the processed workpieces to their original carrier, a new carrier or the tool. Parallel processing of workpieces in this fashion provides improved throughput. Parallel processing may occur in embodiments of the present invention including prealigners 106 with or without buffering capabilities.

While preferred embodiments of the prealigners 106 have been discussed above, it is understood that the prealigners 106 may vary from those described above in alternative embodiments. For example, it is contemplated that the prealigners 106 be mounted on the back surface 114 of the plate 102 in alternative embodiments. Additionally, the prealigners 106 need not have buffering capabilities.

In an alternative embodiment, the functions of the prealigners 106 may be largely performed by the end effector 130. In particular, wafer alignment and ID reading mechanisms may be built into end effector 130, which in this embodiment includes grooved wheels capable of gripping the workpieces. One or more of these wheels can be driven to orient the workpiece. The workpiece can be rotated in the end effector 130 so that the notch may be located by a through beam optical sensor (or a variety of sensor types including the ID reading camera itself). A camera may be mounted on the end effector, or elsewhere on the robot, or elsewhere in the system to read the ID mark.

It is understood that various other components typically included in tool front ends may also be fixedly mounted to plate 102 in alternative embodiments. For example, tool front ends typically include a fan/filter unit for circulating clean air or other gas through the tool front end, and for removing airborne particulates and contaminates from the tool front end. A fan/filter unit of known construction can be bolted to a top portion of the plate 102 or to the frame 110. The fan/filter unit may be bolted to the plate in a perpendicular orientation to the plate, a parallel orientation to the plate, or any angle in between relative to the plate.

The front end system 100 may further include any of the following known components:

- A "Smart-Comm" multiplexor for controlling communications between the front end components and tool controller;
- An RF/IR identification unit—a receiver and/or power supply for receiving signals from an RF pill or an IR tag within the carrier. The RF pill and IR tag transmit information relating to the workpieces. Such RF pills, and systems making use thereof, are described for example in U.S. Pat. Nos. 4,827,110 and 4,888,473 to Rossi et al., and U.S. Pat. No. 5,339,074 to Shindley. Such IR tags, and systems making use thereof, are described for example in U.S. Pat. Nos. 5,097,421, 4,974,166 and 5,166,884 to Maney et al. Each of the above-identified patents is assigned to the owner of the present invention, and each is incorporated by reference in its entirety herein;
- A carrier monitoring system for monitoring a plurality of performance characteristics of workpiece carriers. Details relating to such a system are disclosed in U.S. patent application Ser. No. 09/641,032, to Raymond S. Martin, which application is assigned to the owner of the present application and which application is incorporated by reference in its entirety herein;
- A light tower on front surface 112 including various indicators and warning lights;
- A graphical user interface (GUI) and keyboard on front surface 112 for allowing operator monitoring and control of the front end components and tool;
- An emergency on/off switch on front surface 112 for emergency shut down of all front end and tool operations;
- Ionization bar on back surface 114 for ionizing the environment behind the plate 102 to prevent electrostatic buildup;
- A light curtain and operator/transport safety system on front surface 112. Details relating to such a system are disclosed in U.S. patent application Ser. No. 09/776,227, to Fosnight et al., which application is assigned to the owner of the present invention and which application is incorporated by reference in its entirety herein;
- A workpiece ID reading camera, such as a charge couple display (CCD) camera, and workpiece illumination system;
- Metrology modules on front or back surfaces 112/114 for inspecting workpieces at the front end. Details relating to such systems are disclosed in U.S. Pat. No. 4,893,932 to Knollenberg and U.S. Pat. No. 5,493,123 to Knollenberg, et al., both of which are assigned to the owner of the present invention and both of which are incorporated by reference in their entirety herein; and
- A communication port for person-guided vehicle (PGV)—an IR port for indicating proper alignment of a PGV docking with a load port assembly 106.

It is understood that other known components conventionally provided within a tool front end may additionally be affixed to the front and/or back surfaces 112/114 of plate 102.

In accordance with the present invention, each of the front end components is mounted to the plate 102 in a fixed position (the robot 108 is fixed to the plate for vertical translation along a known path). Integrating the front end components as such has several advantages. First, all front end components are referenced off of a single reference plate. In prior art front end units, the components were affixed to different support mechanisms. This compounded tolerances when the system was constructed and required significant alignment procedures each time the tool front end was installed or modified thereafter. Having each component mounted to a single reference plate significantly reduces tolerance of the front end system, and provides a significant degree of precision and repeatability of the positions of the front end components with respect to each other. This in turn greatly reduces the adjustments that are required when installing or modifying the front end system. Second, integrating all of the components into a single system made by a single manufacturer improves the interoperability of the components. Third, the number of parts in the front end system according to the present invention is reduced in comparison to conventional front end systems while at the same time maintaining all of the functionality of prior art systems. Fourth, integrating the components onto a single plate provides the potential to reduce the overall footprint of the combined front end and tool.

A further advantage is provided by the present invention in that each of the components in the front end system 100 is monitored and controlled by a single controller 109. In a preferred embodiment, controller 109 is a computer, or other programmable computing device, including a plurality of serial ports to which are connected the load port assemblies 104, the prealigners 106, the robot 108 and possibly additional front end components via an RS232 interface. The controller 109 may be affixed to a shelf on the front surface or back surface of the plate 102, and may further include an Ethernet connection to a remote server. The controller 109 may alternatively be located remote from the plate 102. A graphical user interface (GUI) (not shown) may further be provided as part of the controller 109 to provide an operator interface with the front end system 100.

Prior art front end components were manufactured by different component suppliers, each with its own controller, its own software and its own serial and parallel communication wires. In addition to the duplication of hardware, customized software protocols had to be developed to ensure proper communication between the various controllers and components from the different suppliers. Providing an integrated front end system run by a single controller greatly simplifies the software control of the overall system. Additionally, having a single controller reduces the number of parts and cabling necessary to front end operation. This allows for easier installation and maintenance of the system control.

Figure 10:
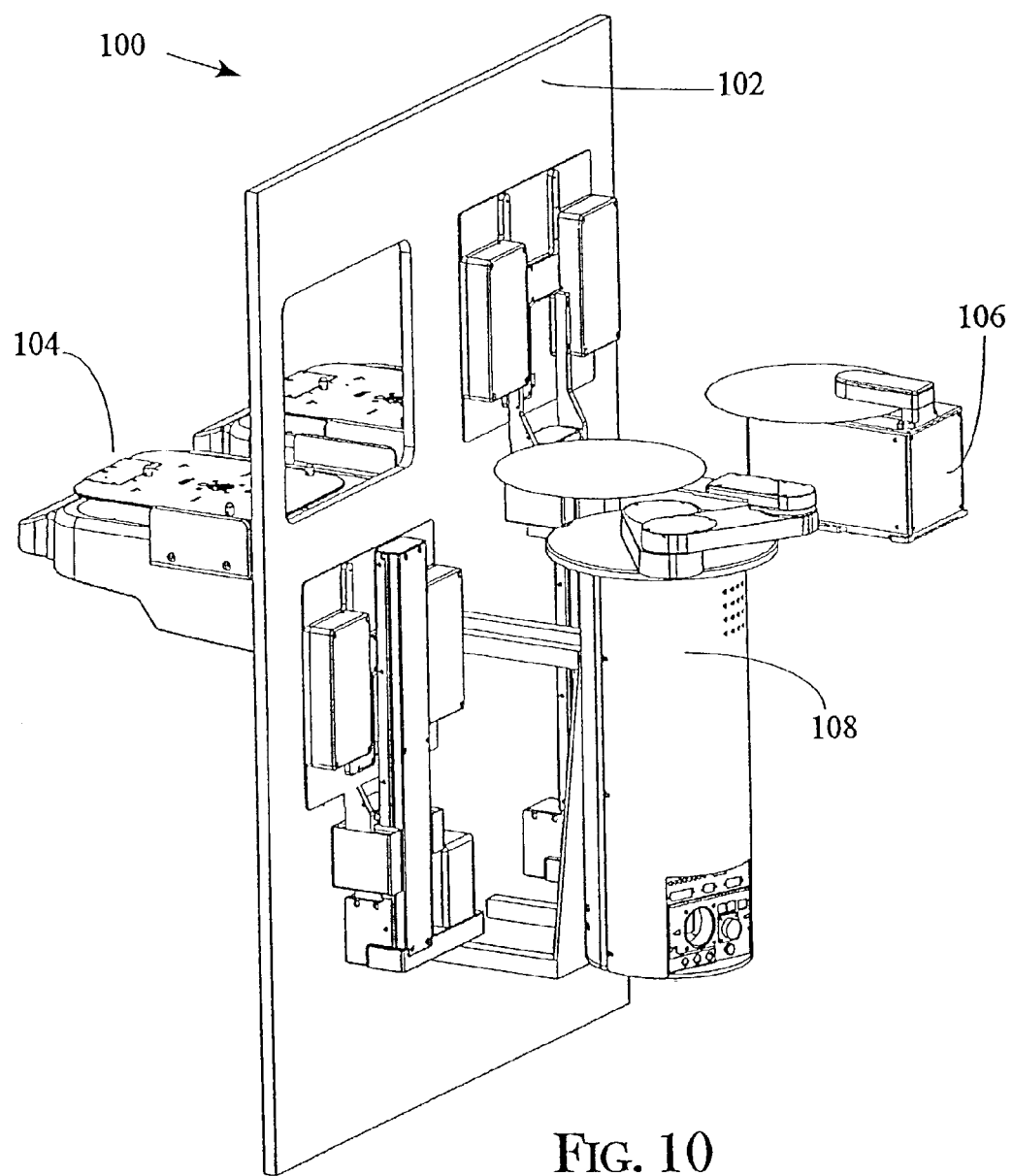
FIG. 10 a rear perspective view of an alternative embodiment of the front end system according to the present invention.
Figure 11:
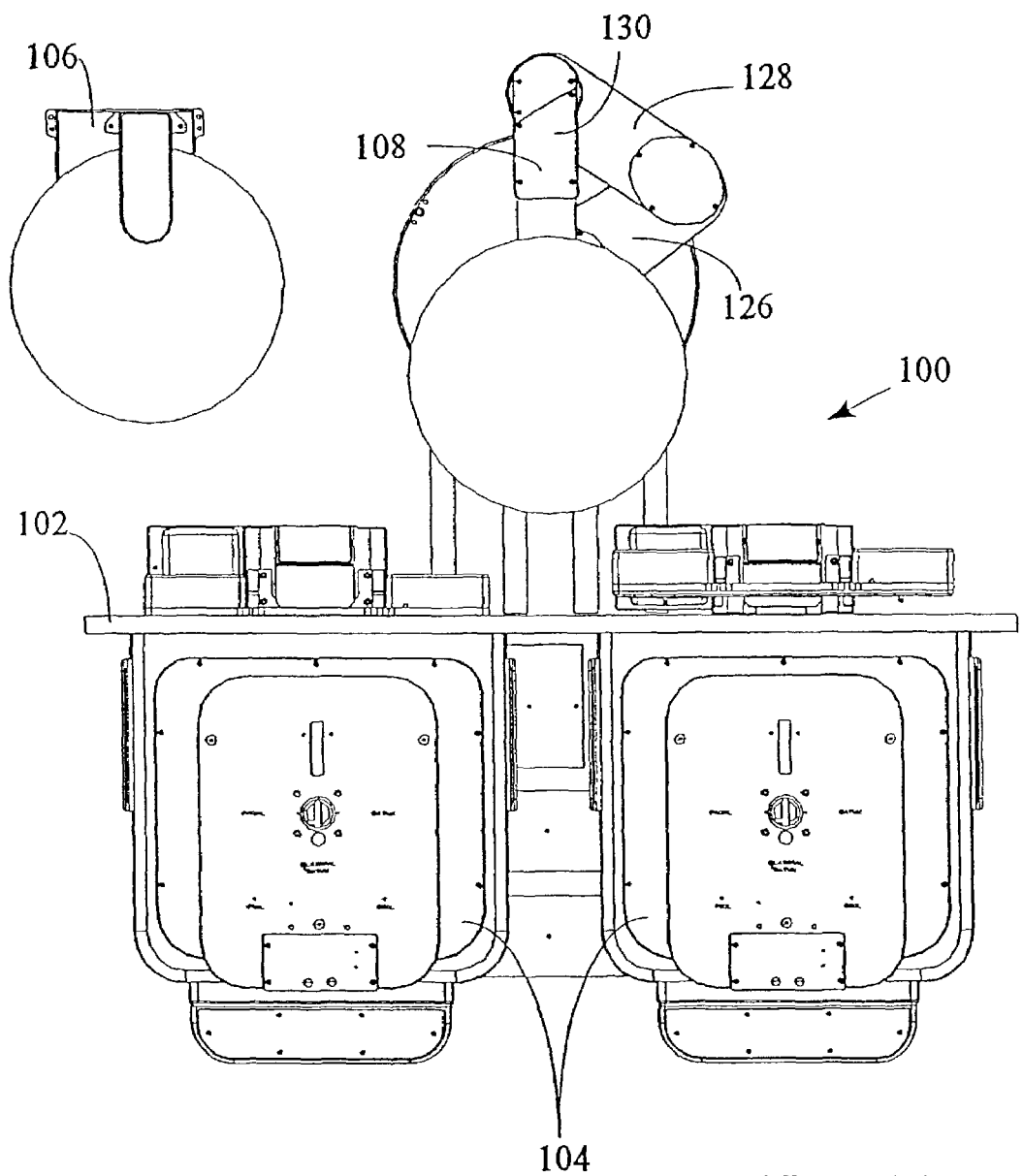
FIG. 11 is a top view of the alternative embodiment of the present invention shown in FIG. 10.

While a preferred configuration of the front end system 100 is shown and described above, other front end configurations are contemplated. For example, while not preferred, less than all of the front end components may be integrated into the front end system 100. For example, as shown in FIGS. 10 and 11, the load port subassemblies, namely, the advance plate subassembly and the port door subassembly, can be mounted to the plate 102. In this embodiment, the robot 108 and/or prealigners 106 be mounted remotely from the plate 102, as by being mounted to a separate support structure from plate 102, or as by being mounted to a support structure that is in turn mounted to the plate 102. It is further contemplated that, in addition to the load port assemblies 104, either the robot 108 or the prealigners 106 be mounted to plate 102, with the remaining component being mounted remotely from the plate 102.

In a further alternative embodiment, the front end system may comprise three, four or more side-by-side load port assemblies 104. In such an embodiment, a horizontal linear slide of known construction (such as including a track similar to track 123) may be mounted to the plate 102, and a vertical linear slide of known construction can be mounted atop the horizontal slide. The first and second arms 126, 128 would be mounted atop the horizontal slide. In such an embodiment, the horizontal and vertical slides can position the arms at the desired X- and Y-positions so that end effector 130 can pick up and drop off workpieces at the various load port assemblies 104. In a further alternative embodiment including greater than two side-by-side load port assemblies, a second robot 108 as described above may be mounted on the back surface 114 and to the side of the plate 102 opposite the side of plate 102 to which the first robot 108 is affixed. In such an embodiment, the first robot 108 could service the load port(s) and prealigner(s) on a first side of the plate 102, and the second robot 108 could service the load port(s) and prealigner(s) on the second, opposed side of the plate. Although not an efficient design, it is contemplated that a robot 108 including a horizontal linear slide mounted to stanchion 124 as described above or a second robot as described above be used in an embodiment of the front end system 100 including only two load port assemblies 104.

Another feature of the present invention is that, having each of the components integrated onto a single plate, the front end system 100 may be easily detached from a first tool, wheeled en masse to a different tool, and affixed to the new tool. Such a transfer of the entire front end of a tool could not be accomplished in the prior art. A blank plate can be affixed to a front of a tool when a front end system 100 according to the present invention is removed from a tool 107 or otherwise not mounted to a tool 107. A frame 110 as is used to affix a front end system 100 to a tool 107 may be used to affix a blank plate to a tool 107. In embodiments of the present invention, components including some or all of the front end components can be mounted to the plate 102 so that they can be easily attached to and removed from a frame 110 or the like, or a tool 107, and moved between tools. In embodiments of the present invention relating to the mobility of the front end system as a single unit, it is understood that the front end components may be affixed to more than one support member, with the respective support members attached to each other.

The front end system 100 according to the present invention comprises a rigid member of unitary construction, with the front end components being mounted to the rigid member in a fixed and repeatable position (the robot being mounted to the rigid member for fixed translation with respect to the rigid member). Up to this point, the rigid member has been described as a vertical plate 102 affixed to the front of the tool 107. In alternative embodiments, the rigid member onto which each of the front end components are mounted need not be vertical and it need not be a plate.

For example, in one such alternative embodiment, the rigid member may be a horizontal plate mounted within the front end of the tool 107. In such an embodiment, the load port assemblies, the prealigners 106 and robot 108 may be mounted on top of the plate in a fixed and repeatable relation to each other. In this embodiment, vertical panels may be mounted above and/or below the reference plate to allow the front end of the tool 107 to be sealed. The vertical panels would intersect the horizontal reference plate so that the load port assemblies 104 would be mounted to the reference plate at a front side of the vertical panels and the robot 108 would be mounted to the reference plate at a back side of the vertical panels. The prealigners 106 could be mounted to the reference plate on the front or back side of the vertical panels.

Figure 12:
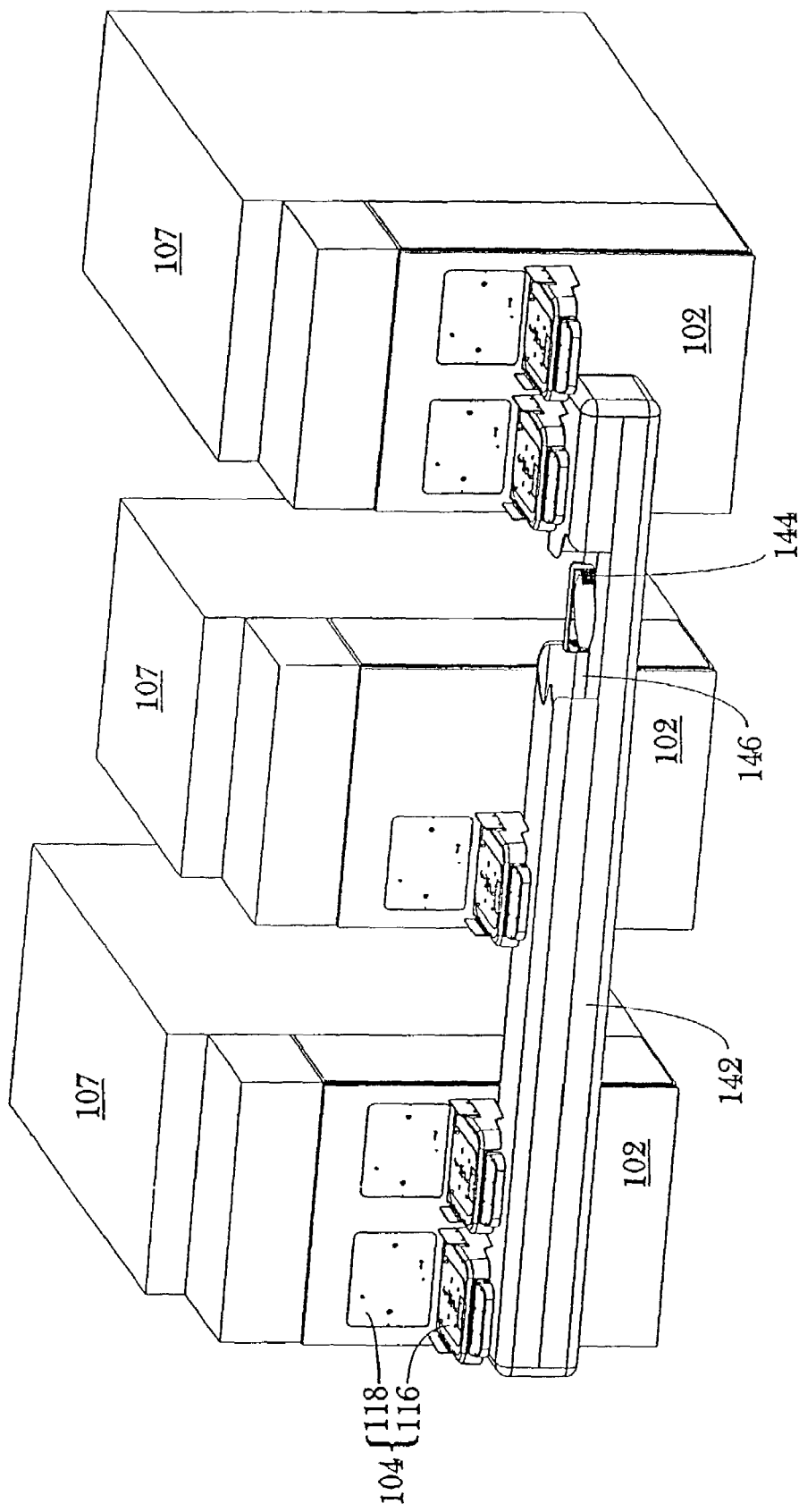
FIG. 12 is a perspective view of a front end system according to a further alternative embodiment of the present invention.
Figure 13:
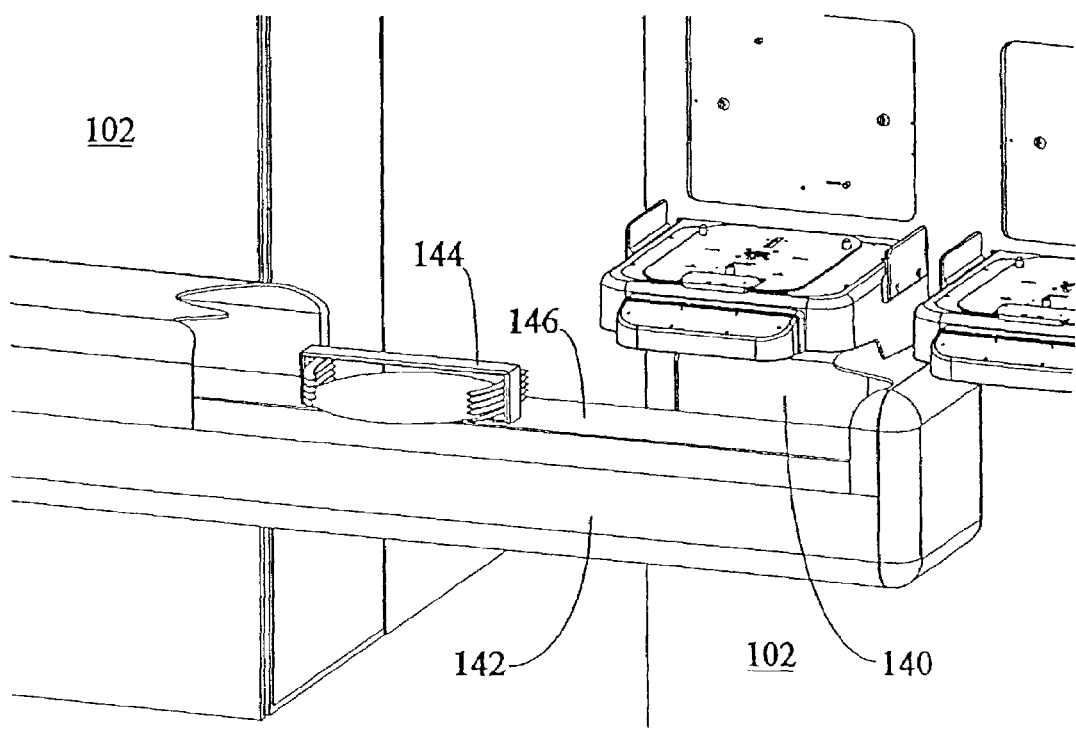
FIG. 13 is an enlarged perspective view of the front end system according to the alternative embodiment shown in FIG. 12.

As indicated above, integrating all of the front end components off of a single reference plate frees up space below the load port assemblies 104 on the front surface 112 of the plate. This space has been unused in conventional front end systems. This space can be used for the prealigners 106 as previously described. Additionally or alternatively, it can be used for individual workpiece transfer between adjacent tools, independent of the workpiece carriers. Such an embodiment is shown in FIGS. 12 and 13. In this embodiment, a port 140 may be provided in the plate 102 below the load port, which port connects to a sealed tunnel 142. The tunnel 142 may house one or more workpiece cassettes 144 which are transported between the two or more tools 107 on a conveyor 146 (FIG. 13 is an enlarged view of FIG. 12, with a portion of the tunnel 142 cut away to show the port 140, the cassette 144, and the conveyor 146). The conveyor 146 may be a known transfer system such as a belt transfer assembly. The tunnel 142 may connect at its opposite end to a port 140 at a second front end unit 100, or a plurality of front end units 100. The top of the tunnel 142 may preferably be approximately 2' to 3' off the ground. Thus, walkways and other mechanisms may be provided to allow operators to climb over the tunnel 142 and walk between tools.

In operation, the robot 108 transfers one workpiece, or a small number of workpieces, through port 140 to a waiting workpiece cassette. The conveyor 146 then transfers the cassette 144 through the tunnel 142 to the destination front end unit, where the conveyor 146 stops and the robot 108 of the next unit transfers the workpiece into that front end unit. Such a system allows for rapid movement of a workpiece or a small number of workpieces between nearby tools without involving traditional inter-tool transports or the sealed workpiece carriers. Additionally, the tunnel transfer system can operate along side of and simultaneously with the traditional inter-tool transport and workpiece carrier system. Neither interferes with the operation of the other.

In the embodiment shown in FIGS. 12 and 13, the respective tools 107 are spaced from each other. It often happens in fabs that the tools are in side-by-side contact with each other. For such tools, inter-tool transport of workpieces can occur in accordance with the embodiment shown in FIGS. 12 and 13, i.e. on the front side of plate 102. Alternatively, for side-by-side tools in contact with each other, adjacent panels 111 of the tools may be omitted, or formed with a sealable port, so that the robots of the respective tools can hand-off workpieces between the tools behind the plates 102. For such an embodiment, a hand-off shelf (not shown) may be provided in one or both tools for receiving a workpiece to be transferred. This shelf would be accessible by the robots from both tools. The hand-off shelf preferably supports the workpieces at their edges, and can include an active or passive workpiece support mechanism.

Workpieces often require inspection after a process is performed thereon. For example, after processing of semiconductor wafers in a process tool, the workpieces are returned to the workpiece carrier, and the carrier is then transferred to a metrology tool for testing and inspection. In accordance with the embodiment shown in FIGS. 12 and 13, the processing and inspection of workpieces can be streamlined by joining the process and metrology tools by the tunnel 142. Single wafers from a wafer lot can be sampled without disrupting the normal work flow. A metrology tool may be similarly joined to a number of process tools, or visa-versa. It is understood that in addition to process and metrology tools, a great many other types of tools may be similarly linked by tunnel 142 or the side-by-side handoff of workpieces as described above.

The system of FIGS. 12 and 13 provides a way of linking several different process steps that normally would require "pod-ing up" of the workpieces in the workpiece carriers and using an inter-tool transport system. Frequently, fabs receive small quantity, very urgent orders that can be satisfied by only a single or a very small number of wafers. The embodiment of FIGS. 12 and 13 provides a fast, clean and efficient way to accomplish this task.

Although the invention has been described in detail herein, it should be understood that the invention is not limited to the embodiments herein disclosed. Various changes, substitutions and modifications may be made thereto by those skilled in the art without departing from the spirit or scope of the invention as described and defined by the appended claims.

We claim:

1. A system for transporting a workpiece, comprising:
   a first process tool having a plate mounted to a front end of said first process tool, a load port assembly and a port door, said plate having a port door aperture and a workpiece transfer opening, said port door for moving between a open position and a closed position;
   a second process tool having a plate mounted to a front end of said second process tool, a load port assembly and a port door, said plate having an port door aperture and a workpiece transfer opening, said port door for moving between a open position and a closed position;
   a workpiece transfer tunnel providing an enclosed connection between said workpiece transfer opening of said first process tool and said workpiece transfer opening of said second process tool; and
   a workpiece transfer apparatus for receiving a workpiece from the interior of said first process tool through said workpiece transfer opening and transporting the workpiece within said workpiece transfer tunnel directly to said workpiece transfer opening of said second process tool, wherein said workpiece is transported in a horizontal orientation;
   wherein multiple workpieces are transported in a stacked horizontal orientation and wherein each of the multiple workpieces are supported on a bottom peripheral edge.

2. The system as recited in claim 1, wherein said workpiece transfer opening in said plate of said first and second process tools is located at a lower elevation in said plate than said port door aperture.

3. The system as recited in claim 1, wherein said port door of said second process tool, when located in said open position, allows a workpiece to pass unobstructed through said port door aperture and said workpiece transfer opening.

4. The system as recited in claim 1, wherein said load port assembly of said first process tool includes a container advance plate for moving a container towards and away from said plate.

5. The systems as recited in claim 4, further including a workpiece handling robot being adapted to access both said container and said workpiece transfer opening.

6. The system as recited in claim 1, wherein said load port assembly of said second process tool includes a container advance plate for moving a container towards and away from said plate.

7. The systems as recited in claim 6, further including a workpiece handling robot being adapted to access both the container and said workpiece transfer opening.

8. A system for transporting a workpiece between a first process tool and a second process tool, the first and second process tools each include an interior, a front plate having a port door aperture and a workpiece transfer opening, the system comprising:
   a workpiece transfer tunnel providing an enclosed connection between the workpiece transfer opening of the first process tool and the workpiece transfer opening of the second process tool; and
   a workpiece transfer apparatus for receiving a workpiece from the interior of the first process tool through the workpiece transfer opening and transporting the workpiece within said workpiece transfer tunnel to the workpiece transfer opening of the second process tool, wherein said workpiece is transported in a horizontal orientation;
   wherein multiple workpieces are transported in a stacked horizontal orientation and wherein each of the multiple workpieces are supported on a bottom peripheral edge.

9. The system as recited in claim 8, wherein the workpiece transfer opening in the front plate of the first process tool is located at a lower elevation in the front plate than the port door aperture.

10. The system as recited in claim 8, wherein the workpiece transfer opening in the front plate of the second process tool is located at a lower elevation in the front plate than the port door aperture.

11. A system for transporting a workpiece between the interior of a first process tool and a the interior of a second process tool, wherein both the first and second process tools each have a front end, the system comprising:
   a first front plate being adapted to secure to the front end of the first process tool, said first front plate having a port door aperture and a workpiece transfer opening;
   a second front plate being adapted to secure to a front end of the second process tool, said second front plate having a port door aperture and a workpiece transfer opening;
   a workpiece transfer mechanism for transferring a workpiece directly between said workpiece transfer opening of said first front plate and said workpiece transfer opening of said second front plate, including:
      a workpiece transfer tunnel connected between said workpiece transfer opening of said first front plate and said workpiece transfer opening of said second front plate;
      a workpiece transfer apparatus for receiving a workpiece from the interior of the first process tool through the workpiece transfer opening of said first front plate and transporting the workpiece within said workpiece transfer tunnel to said workpiece transfer opening of said second front plate, wherein said workpiece is transported in a horizontal orientation;

wherein multiple workpieces are transported in a stacked horizontal orientation and wherein each of the multiple workpieces are supported on a bottom peripheral edge.

12. The system as recited in claim 11, wherein said workpiece transfer opening in said first front plate is located at a lower elevation in said first front plate than said port door aperture.

13. The system as recited in claim 11, wherein said workpiece transfer opening in said second front plate is located at a lower elevation in said second front plate than said port door aperture.

* * * * *